(12) United States Patent
Anzai

(10) Patent No.: US 6,872,650 B2
(45) Date of Patent: Mar. 29, 2005

(54) BALL ELECTRODE FORMING METHOD

(75) Inventor: Yasuhito Anzai, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/630,843

(22) Filed: Jul. 31, 2003

(65) Prior Publication Data

US 2004/0053488 A1 Mar. 18, 2004

(30) Foreign Application Priority Data

Sep. 12, 2002 (JP) ........................................ 2002-266867

(51) Int. Cl.[7] .............................................. H01L 21/50
(52) U.S. Cl. ........................ 438/612; 438/108; 438/456; 438/673; 438/701; 438/945; 438/978
(58) Field of Search .............................. 438/107, 108, 438/456, 612, 613, 614, 615, 616, 617, 673, 701, 928, 945, 978, FOR 308, FOR 315, FOR 343, FOR 458, FOR 473, FOR 492, E23.021

(56) References Cited

U.S. PATENT DOCUMENTS 5,672,542 A * 9/1997 Schwiebert et al. ........... 438/4
5,880,017 A * 3/1999 Schwiebert et al. ........ 438/613
2002/0180013 A1 * 12/2002 Brofman et al. ............ 257/678
2003/0045023 A1 * 3/2003 Jeon .......................... 438/106

FOREIGN PATENT DOCUMENTS

JP          07-212021        8/1995

* cited by examiner

Primary Examiner—George Fourson
Assistant Examiner—Joannie Adelle Garcia
(74) Attorney, Agent, or Firm—Rabin & Berdo, P.C.

(57) ABSTRACT

A ball electrode forming method comprises steps of: preparing a semiconductor apparatus having a plurality of electrode pads; arranging a mask having an upper surface and a lower surface, an area in the lower surface being larger than an area in the upper surface, and a plurality of openings extended from the upper surface to the lower surface, on a surface of the semiconductor apparatus having the electrode pads formed thereon so that the surface and the lower surface can face each other; arranging solder balls on the electrode pads arranged in the openings from the upper surface side of the mask; and electrically connecting the solder balls to the electrode pads to form ball electrodes. Thus, regarding a method for forming a ball electrode in a semiconductor apparatus having a BGA structure, an efficient ball electrode forming method is employed to prevent omission of a ball electrode.

21 Claims, 3 Drawing Sheets

BALL ELECTRODE FORMING METHOD

BACKGROUND OF THE INVENTION

The present invention relates to a ball electrode forming method, and more particularly to a technology effectively applied to a semiconductor apparatus mounted on a wiring board or the like through the ball electrode.

Following high performance and miniaturization of electronic devices achieved in recent years, multiple pins and light, thin and short forms are required of semiconductor apparatus used for such electronic devices.

In response to such a tendency, as described in a well-known patent document (Japanese Patent Application Laid-Open No. 212021/1995), there has been presented a semiconductor apparatus of a so-called ball grid array (BGA) structure where external terminals corresponding to electrode pads of semiconductor devices are arranged in a matrix.

In the semiconductor apparatus that employs the BGA structure, for example, very small solder balls having diameters of about 0.5 to 0.7 mm are arranged in an array to be apart from one another at predetermined intervals, which function as external electrodes. Thus, many external electrodes are densely disposed on one surface of the semiconductor apparatus, consequently providing a package which enables transfer of many signals between the outside and the semiconductor devices.

An example of a method for forming a ball electrode in the conventional semiconductor apparatus of the BGA structure will be described below.

First, a semiconductor apparatus is prepared, which has a plurality of electrode pads electrically connected to semiconductor devices formed on the surface of a semiconductor substrate.

Subsequently, on the surface of the semiconductor apparatus where the electrode pads are disposed, a flux is applied to remove oxide films formed on the surfaces of the electrode pads and the solder balls.

Then, a mask having a plurality of openings is arranged on the flux-applied surface of the semiconductor apparatus. At this time, a corresponding flux-applied electrode pad is exposed from each of the plurality of openings formed on the mask.

After the mask is arranged in a predetermined position on the surface of the semiconductor apparatus, the solder balls are arranged in the openings formed in the mask. The solder ball arranged in each opening is fixed on the flux of the electrode pad exposed from the opening of the mask, and electrically connected to the electrode pad to form a ball electrode.

SUMMARY OF THE INVENTION

In the conventional ball electrode forming method, the oxide films formed on the surfaces of the electrode pads and the solder balls are removed by the flux applied on the surface of the semiconductor apparatus. This removal of the oxide films has a close relation to joining strength between the electrode pad and the solder ball, and an electric connection on a joining interface, and greatly affects a reduction in reliability of the semiconductor apparatus. Thus, in the conventional art, in order to assure removal of the oxide films formed on the surfaces of the electrode pads and the solder balls, a viscous substance has been used for a flux material applied on the surface of the semiconductor apparatus.

However, in the case of the conventional art that uses the flux having viscosity, especially if a flux of high viscosity is used, large surface tension occurs on the flux-applied surface of the semiconductor apparatus. An influence of this surface tension has created, during ball electrode formation, a problem of adherence of a surplus flux to the side face of the opening of the mask used for the ball electrode formation.

The flux that has adhered to the side face of the opening fixes the solder ball arranged in the opening to the side face of the opening of the mask. Consequently, in a removal step of the mask from the surface of the semiconductor apparatus carried out to obtain a desired semiconductor apparatus of a BGA structure after the ball electrode formation, there is a danger that the solder ball may be peeled off from the surface of the semiconductor apparatus together with the mask.

That is, there is a danger that the solder ball constituting the ball electrode may be removed from the surface of the surface of the semiconductor apparatus during the mask removal, manufacturing a semiconductor apparatus which includes a ball electrode omitted terminal.

Accordingly, regarding a ball electrode forming method of a semiconductor apparatus having a BGA structure, an object of the present invention is to provide an efficient ball electrode forming method which prevents omission of a ball electrode.

In order to achieve the object, a representative ball electrode forming method of the present invention comprises the steps of: preparing a semiconductor apparatus having semiconductor devices and a plurality of electrode pads electrically connected to the semiconductor devices; arranging a mask having an upper surface and a lower surface, an area in the lower surface being larger than an area in the upper surface, and a plurality of openings extended from the upper surface to the lower surface, on a surface of the semiconductor apparatus having the electrode pads formed thereon so that the surface and the lower can surface face each other; arranging solder balls on the electrode pads arranged in the openings from the upper surface side of the mask; and electrically connecting the solder balls to the electrode pads to form ball electrodes.

Another example of a ball electrode forming method comprises the steps of: peeling off a semiconductor apparatus from a wiring board, the semiconductor apparatus having semiconductor devices and a plurality of electrode pads electrically connected to the semiconductor devices, and being mounted on the wiring board by a plurality of first ball electrodes formed on the plurality of electrode pads; after the peeling step, arranging a mask having an upper surface and a lower surface, an area in the lower surface being larger than an area in the upper surface, and a plurality of openings extended from the upper surface to the lower surface, on a surface of the semiconductor apparatus having the electrode pads formed thereon so that the surface and the lower surface can face each other; arranging solder balls on the electrode pads arranged in the openings from the upper surface side of the mask; and electrically connecting the solder balls to the electrode pads to form second ball electrodes on the electrode pads where the first ball electrodes have been formed.

Therefore, according to the present invention, the efficient ball electrode forming method is provided, which prevents omission of the ball electrode.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Hereinafter, a first embodiment of the present invention will be described by referring to FIGS. 1A to 1E.

FIGS. 1A to 1E are process sectional views showing a manufacturing method of a semiconductor apparatus which uses a ball electrode forming method of the first embodiment of the present invention.

Figure 1A:
FIGS. 1A to 1E are process sectional views showing a ball electrode forming method of a first embodiment of the present invention.

As shown in FIG. 1A, first, for example, a semiconductor apparatus 101 is prepared, which has semiconductor devices such as a memory device and a functional device formed on the surface of a semiconductor substrate, and a plurality of electrode pads 102 electrically connected to the semiconductor devices.

Figure 1B:
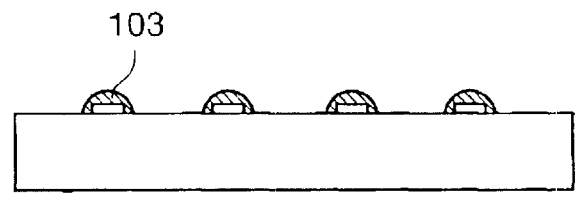

Then, as shown in FIG. 1B, fluxes 103 are applied on one surface of the semiconductor apparatus 101 having the electrode pads 102 formed thereon by using a brush, a roller or the like. Accordingly, the fluxes 103 are applied on the electrode pads 102 formed on the surface of the semiconductor apparatus 101. By these fluxes 103, oxide films formed on the surfaces of the electrode pads and solder balls are removed. That is, preferably, the fluxes 103 are applied on the surface of the semiconductor apparatus 101 so as to cover at least the electrode pads 102 formed thereon.

Figure 1C:
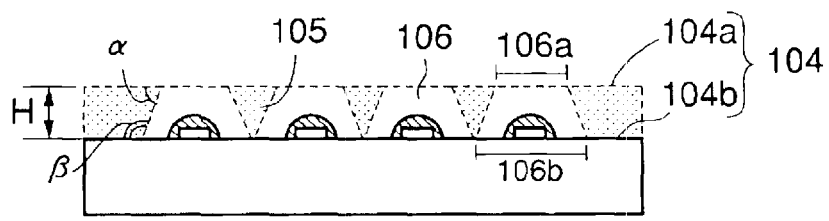

After the application of the fluxes 103 on the surface of the semiconductor apparatus 101, as shown in FIG. 1C, a mask 104 having upper and lower surfaces 104a and 104b and a plurality of openings 106 run through from the upper surface 104a to the lower surface 104b is arranged so that the lower surface of the mask 104 can face the surface of the semiconductor apparatus having the electrode pads 102 formed thereon. In this case, from each of the openings 106 disposed in the mask 104, the electrode pad 102 formed on the surface of the semiconductor apparatus 101 and the flux 103 applied on the electrode pad 102 are exposed.

Each of the plurality of openings 106 can be formed in the mask 104 so that an area 106b of the opening 106 in the lower surface is larger than an area 106a thereof in the upper surface.

In the ball electrode forming method of the first embodiment, a section of the opening 106 formed in the mask 104 has a trapezoidal shape expanded from the upper surface to the lower surface. In other words, the opening 106 has a first side face 105 extended from the upper surface 104a to the lower surface 104b, and it is characterized in that an angle α between the first side face 105 and the upper surface 104a is smaller than an angle β between the first side face 105 and the lower surface 104b. Specifically, preferably, the angle α between the first side face 105 and the upper surface 104b is ser to about 60°, and the angel β between the first side face 105 and the lower surface 104b is set to about 120°. The setting of the angle α between the first side face 105 and the upper surface 104a to about 60° enables suppression of horizontal shifting of a solder ball subsequently inserted into the opening 106, and accurate control of a mounting position.

Figure 1D:
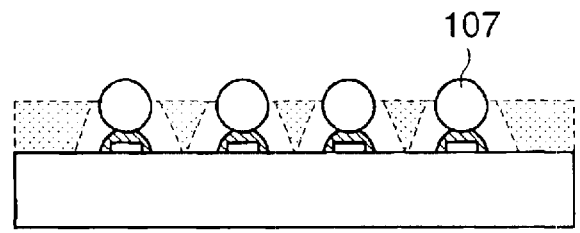

Then, as shown in FIG. 1D, many solder balls are poured through the surface of the semiconductor apparatus 101 having the mask 104 arranged therein to be inserted from the upper surfaces 104a of the openings 106 disposed in the mask 104 into the openings 106. In this case, surplus solder balls not inserted into the openings 106 are removed from the surface of the semiconductor apparatus 101 to be collected again.

After the removal of the surplus solder balls and the insertion of the solder balls into the openings 106, the semiconductor apparatus 101 is heated by, for example, reflowing or the like to about 220 to 260° C. while the mask 104 is kept fixed on the surface. Thus, the solder balls on the fluxes 103 are melted to be deposited on the electrode pads 102. Accordingly, a ball electrode of the semiconductor apparatus 101 is formed.

Figure 1E:
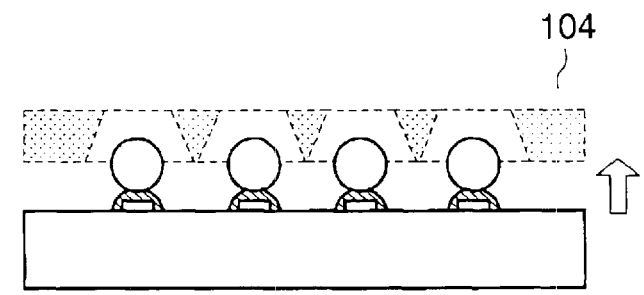

Lastly, as shown in FIG. 1E, the mask 104 is removed from the surface of the semiconductor apparatus 101, and cleaning is carried out to remove the surplus flux 103 or the like. Accordingly, the semiconductor apparatus of the BGA structure where a plurality of ball electrodes 107 are arranged in an array is manufactured.

The first side face 105 of the opening 106 disposed in the mask 104 is tapered in shape, and the ball electrode is formed by using the mask 104 where the area of the opening 106 on the mask upper surface is larger than the largest sectional area of the solder ball subsequently inserted into the opening 106. In this way, it is possible to prevent adhesion of the surplus flux 103 generated at the time of insertion of the solder ball into the opening 106 to the side face 105 thereof. As a result, according to the ball electrode forming method of the first embodiment, the efficient ball electrode forming method is employed to enable sure prevention of omission of ball electrodes, and easy and sure formation of a ball electrode in the semiconductor apparatus of the BGA structure.

Furthermore, according to the ball electrode forming method of the first embodiment, without considering surface tension of the flux 103 on the surface of the semiconductor apparatus 101, even a flux of 103 of a type of relatively high viscosity can be applied on the surface of the semiconductor apparatus 101. In such a case, when many solder balls are poured through the upper surface 104a of the mask 104 to be inserted into the openings 106, the viscosity of the flux 103 enables fixing of the solder balls in positions corresponding to the electrode pads 102.

As a result, each solder ball is held by the flux 103 on the semiconductor apparatus 101 and, before a heat treatment step of the solder ball, the mask 104 can be removed from the surface of the semiconductor apparatus 101. That is, since at the time of solder ball melting application of heat is not necessary for the mask 104 to form the ball electrode 107, it is not necessary to consider heat at the time of solder ball melting, an affinity to the solder ball, and wettability when a constituting material of the mask 104 is selected. Therefore, as the constituting material of the mask 104, it is possible to employ a constituting material which can accurately realize a tapered shape of the mask 104 of the embodiment.

However, regarding the viscosity of the flux 103, a flux of viscosity must be properly selected which can provide sufficient joining strength between the solder ball and the electrode pad constituting the ball electrode 107, and prevent a reduction in workability of the applying step of the flux 103 after reflowing.

Hereinafter, the mask 104 used for the ball electrode forming method of the first embodiment will be described in detail.

In the mask 104 used in the embodiment, the plurality of openings 106 roughly circular in planar shape and trapezoidal in sectional shape are arranged in positions facing the surface of the semiconductor apparatus 101 so as to be expanded from the upper surface from which the solder balls are inserted to the lower surface. These openings 106 are arranged in positions apart from one another by predetermined distances.

Each opening 106 tapered in sectional shape is formed by, for example laser processing, precision milling processing, etching processing or the like. In the case of laser processing, an output is gradually changed to form an opening tapered in shape.

According to the present invention, the area of the opening 106 on the mask lower surface 104b only needs to be larger than that of the opening 106 on the upper surface 104a. Preferably, however, the area of the opening 106 on the upper surface 104a is decided in order to efficiently insert the solder ball into the opening 106, and by considering a diameter of the solder ball melted on the electrode pad 102 by heat treatment such as reflowing.

Further, a thickness H of the mask 104 is preferably set to, for example, about 0.3 to 0.4 mm. When the semiconductor apparatus 101 having the solder balls inserted into the openings 106 is inclined by a fixed angle to remove a surplus solder ball, the thickness is preferably set to about 60 to 70% of a diameter of each of the solder balls inserted into the openings 106 so as to prevent elimination of the solder balls inserted into the openings 106.

The mask 104 of the embodiment has been described based on the roughly circular planar shape of the opening 106. However, the opening 106 is not limited to the circular shape, and it may be a polygonal shape.

The ball electrode forming method of the embodiment can be used to form a ball electrode for manufacturing a semiconductor apparatus of a BGA structure in mass production. Especially, in the semiconductor apparatus of the BGA structure mounted as one component after completion on a wiring board on which a plurality of electronic components are mounted, the method is effective when applied to form a ball electrode again, for example, in the case of carrying out failure analysis to find a cause of an electric failure in the semiconductor apparatus of the BGA structure.

Hereinafter, description will be made of the case of carrying out electric failure analysis in the semiconductor apparatus of the BGA structure.

First, a semiconductor apparatus having an electrically failed place is peeled off from a wiring board (mother board) having a plurality of electronic components mounted thereon. In this case, ball electrodes (first ball electrodes) that have made electric connections with the wiring board are also partially peeled off from the semiconductor apparatus.

Subsequently, ball electrodes left on electrode pads and solder ball wastes left on electrode pads from which the ball electrodes have been peeled off are removed by using a soldering iron or the like. Then, the surface of the semiconductor apparatus is cleaned.

After the cleaning step, a mask 104 having a plurality of openings 106 tapered in sectional shape is arranged on the surface of the semiconductor apparatus where the electrode pads are formed. Then, by a method similar to the ball electrode forming method of the first embodiment, ball electrodes (second ball electrodes) which become necessary for specifying an electrically failed place are formed on the electrode pads of the semiconductor apparatus having the failed place.

After the formation of the ball electrodes for failure analysis on the electrode pads of the semiconductor apparatus having the failed place, a terminal such as a tester is brought into contact with each of the new ball electrodes to carry out desired electric analysis for the semiconductor apparatus, whereby failure analysis of the semiconductor apparatus is carried out.

Thus, by applying the ball electrode forming method of the first embodiment to, for example a re-ball step in each semiconductor apparatus including a failed place, which is peeled off from the wiring board (ball electrode re-forming step of re-forming a ball electrode omitted by a peeling step of peeling off each semiconductor apparatus including the failed place from the wiring board to return to a state which enables electric contact with the tester terminal for carrying out failure analysis), elimination of solder balls by an influence of surface tension of the flux can be prevented. Since this is generally a step carried out for one semiconductor apparatus where a failure is discovered, a rearrangement step of solder balls that has been manually done can be carried out altogether. As a result, it is possible to greatly shorten work time of the failure analysis.

Here, different from a mask used by a machine operation for forming ball electrodes in mass production, which targets a number of semiconductor apparatus, the mask used in the re-ball step targets a small number of semiconductor apparatus having failed places. Thus, the mask is often handled manually. Therefore, for a material of the mask in the re-ball step, a material having not only easiness of processing during opening formation but also strength to prevent breakage or omission during handling, e.g., a metal material such as stainless, is preferable.

Next, a semiconductor apparatus of a second embodiment of the present invention will be described by referring to FIGS. 2A to 2E and FIGS. 3A and 3B.

FIGS. 2A to 2E are process sectional views showing a ball electrode forming method of the second embodiment of the present invention. Components similar to those of the first embodiment are denoted by similar reference numerals, and detailed description thereof will be omitted.

Figure 2A:
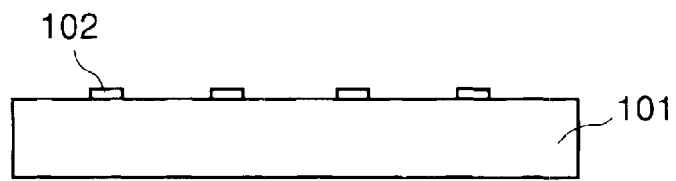
FIGS. 2A to 2E are process sectional views showing a ball electrode forming method of a second embodiment of the present invention.
Figure 2B:
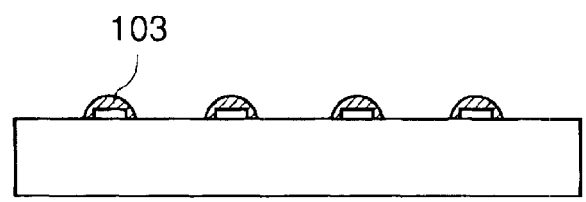
Figure 2C:
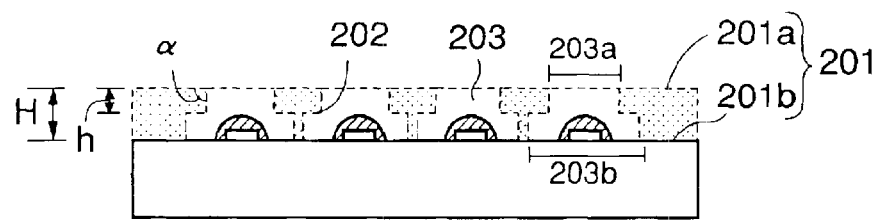

The ball electrode forming method of the second embodiment is different from that of the first embodiment in that as shown in FIG. 2C, a mask 201 is used where a plurality of openings, each opening comprising a first cylindrical space disposed in a mask upper surface 201a side and a second cylindrical space disposed in a mask lower surface 201b side to be larger in volume than the first cylindrical space, i.e., openings 203 convex in sectional shape.

That is, the ball electrode forming method of the second embodiment is characterized by the use of the mask 201 where the opening 203 is disposed, which has a first cylindrical side face disposed in the mask upper surface 201a side, in which an angle between a part of a side face 202 of the opening run through from the mask upper surface 201a to the mask lower surface 201b, and the mask upper surface 201a is roughly vertical.

Hereinafter, the ball electrode forming method of the second embodiment will be described by referring to FIGS. 2A to 2E.

As shown in FIG. 2A, first, for example, a semiconductor apparatus 101 is prepared, which has semiconductor devices such as a memory device and a functional device formed on the surface of a semiconductor substrate, and a plurality of electrode pads 102 electrically connected to the semiconductor devices.

Then, as shown in FIG. 2B, fluxes 103 are applied on one surface of the semiconductor apparatus 101 having the electrode pads 102 formed thereon.

After the application of the fluxes 103, as shown in FIG. 2C, a mask 201 having upper and lower surfaces 201a and 201b and a plurality of openings 203 run through from the upper surface 201a to the lower surface 201b is arranged so that the lower surface 201a of the mask 201 can face the surface of the semiconductor apparatus having the electrode pads 102 formed thereon. In this case, from each of the openings 203 disposed in the mask 201, the electrode pad 102 formed on the surface of the semiconductor apparatus 101 and the flux 103 applied on the electrode pad 102 are exposed.

Each of the plurality of openings 203 is formed in the mask 201 so that an area 203b of the opening 203 in the lower surface 201b can be larger than an area 203a thereof in the upper surface.

In the ball electrode forming method of the second embodiment, the opening 203 formed in the mask 201 comprises a first cylindrical space disposed in the mask upper surface 201a, and a second cylindrical space disposed in the mask lower side 201b to be larger in volume than the first. In other words, its sectional shape is convex.

Figure 2D:
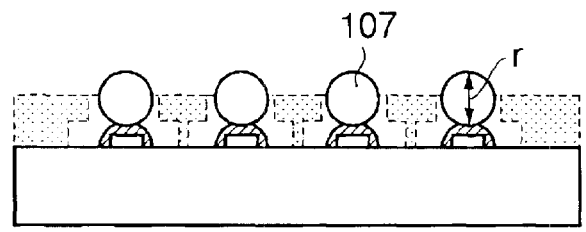

Then, as shown in FIG. 2D, many solder balls are poured through the surface of the semiconductor apparatus 101 having the mask 201 arranged therein to be inserted from the upper surfaces 201a of the openings 203 disposed in the mask 201 into the openings 203. Then, the semiconductor apparatus 101 and the solder balls are heated by, for example reflowing or the like of about 220 to 260° C.

Figure 2E:
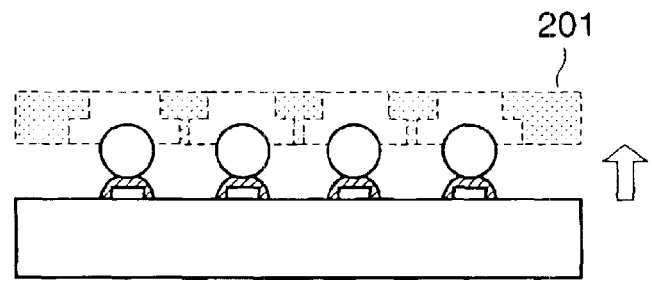

Lastly, as shown in FIG. 2E, the mask 201 is removed from the surface of the semiconductor apparatus 101, and cleaning is carried out to remove the surplus flux 103 or the like. Accordingly, the semiconductor apparatus of the BGA structure where a plurality of ball electrodes 107 are arranged in an array is manufactured.

A distance (thickness H of the mask) of the mask 201 from the mask upper surface 201a to the mask lower surface 201b may be set to, for example about 0.3 to 0.4 mm as in the case of the first embodiment. A length h of the side face of the first cylindrical space forming the roughly vertical angle with the mask upper surface 201a may be set to a length where a plane roughly parallel to the mask upper surface 201a and run through the center of the solder ball inserted into the opening 203 is positioned in a range of the side face of the first cylindrical space, i.e., a length of about ⅔ or higher of a diameter r of the solder ball mounted on the electrode pad 102.

For example, if the diameter r of the solder ball is 0.4 mm, preferably, the thickness H of the mask 201 is set to 0.3 to 0.4 mm, and the length h of the side face forming the roughly vertical angle with the mask upper surface 201a is set to about 0.2 mm.

Thus, according to the ball electrode forming method of the second embodiment using the mask 201 which has the plurality of openings 203 convex in sectional shape, the solder ball inserted into each opening 203 is supported by a part of the mask side face 202 forming the roughly vertical angel with the mask upper surface 201a before deposition on the electrode pad 102. In other words, compared with the ball electrode forming method of the first embodiment which uses the mask 104 having the openings 106 trapezoidal in sectional shape, in the case of the second embodiment which uses the mask 201 having the plurality of openings 203 convex in sectional shape, a contact area of the solder ball with the mask side face is enlarged and, as a result, horizontal shifting of the solder ball in each opening 203 is prevented to improve position accuracy of mounting the solder ball.

As in the case of the ball electrode forming method of the first embodiment, the second embodiment can be applied at the time of re-forming a ball electrode when failure analysis is carried out and, when applied, rearrangement step of solder balls in a ball electrode omitted terminal that has been manually done can be carried out altogether. As a result, it is possible to greatly shorten work time of the failure analysis.

Figure 3A:
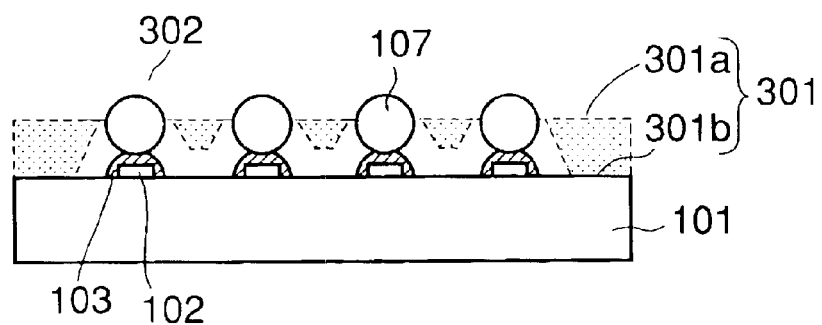
FIGS. 3A and 3B are views showing other masks used in the ball electrode forming methods of the first and second embodiments of the present invention.
Figure 3B:
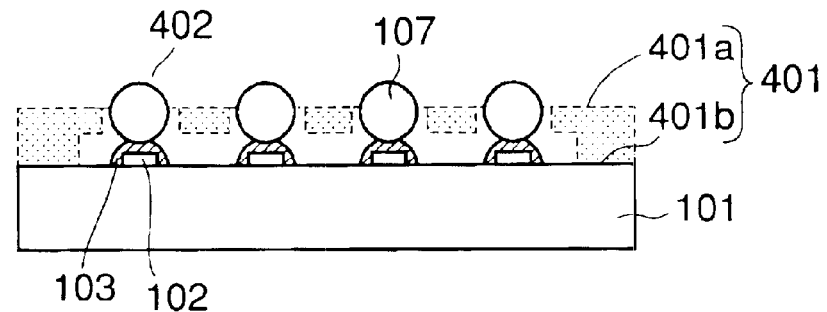

According to the first and second embodiments, it is possible to use masks 301, 402 where adjacent openings 302, 402 similar to those shown in FIGS. 3A and 3B are interconnected in mask lower surfaces 301b, 401b.

According to the ball electrode forming method that uses such masks 301, 401, compared with the formation of ball electrodes using the mask 104 of FIGS. 1A to 1E and the mask 201 of FIGS. 2A to 2E having the electrode pads 102, it is possible to prevent adhesion of fluxes to the side faces of the openings more surely.

As described above, according to the present invention, the area in the mask lower surface is set larger than that in the mask upper surface, and the ball electrode is formed in the semiconductor apparatus by using the mask having the plurality of openings extended from the mask upper surface to the mask lower surface. Thus, it is possible to prevent adhesion of surplus fluxes to the side faces of the openings, which occurs when the solder balls are inserted into the openings to be mounted on the electrode pads. As a result, the efficient ball electrode forming method is employed to assure prevention of omission of a ball electrode, and to enable easy and sure formation of a ball electrode in the semiconductor apparatus of the BGA structure.

What is claimed is:

1. A ball electrode forming method, comprising:
    preparing a semiconductor apparatus having a plurality of semiconductor devices and a plurality of electrode pads disposed on a surface of the semiconductor apparatus, the electrode pads being electrically connected to the semiconductor devices;
    providing a mask having an upper surface, a lower surface, and a plurality of openings extended from the upper surface to the lower surface, an area of each of the openings at the lower surface being larger than an area of the openings at the upper surface;
    arranging the mask on the surface of the semiconductor apparatus so that the surface of the semiconductor apparatus and the lower surface of the mask face each other;
    arranging a plurality of solder balls on the electrode pads arranged in the openings from an upper surface side of the mask; and
    electrically connecting the solder balls to the electrode pads to form ball electrodes.

2. The ball electrode forming method according to claim 1, further comprising:
    applying fluxes on the electrode pads before the step of arranging the mask.

3. The ball electrode forming method according to claim 1,
wherein each of the openings has a first side face extended from the upper surface to the lower surface, and an angle between the first side face and the upper surface is smaller than an angle between the first side face and the lower surface.

4. The ball electrode forming method according to claim 3,
wherein the angle between the first side face and the upper surface is roughly 60° or lower.

5. The ball electrode forming method according to claim 1,
wherein each of the openings has a second side face extended from the upper surface to the lower surface, and an angle between the second side face and the upper surface is vertical.

6. The ball electrode forming method according to claim 5,
wherein a height of the second side face forming the vertical angle with the upper surface is equal to or higher than a radius of each of the solder balls.

7. The ball electrode forming method according to claim 1,
wherein the openings are interconnected at a lower surface side of the mask.

8. A ball electrode forming method, comprising:
peeling off a semiconductor apparatus from a wiring board, the semiconductor apparatus having a plurality of semiconductor devices and a plurality of electrode pads disposed on a surface of the semiconductor apparatus, the electrode pads being electrically connected to the semiconductor devices, and being mounted on the wiring board by a plurality of first ball electrodes formed on the electrode pads;
providing a mask having an upper surface, a lower surface, and a plurality of openings extended from the upper surface to the lower surface, an area of each of the openings at the lower surface being larger than an area of the openings at the upper surface;
after the peeling step, arranging the mask on the surface of the semiconductor apparatus so that the surface of the semiconductor apparatus and the lower surface of the mask face each other;
arranging a plurality of solder balls on the electrode pads arranged in the openings from an upper surface side of the mask; and
electrically connecting the solder balls to the electrode pads to form second ball electrodes on the electrode pads where the first ball electrodes have been formed.

9. The ball electrode forming method according to claim 8, further comprising:
applying fluxes on the electrode pads before the step of arranging the mask.

10. The ball electrode forming method according to claim 8,
wherein each of the openings has a first side face extended from the upper surface to the lower surface, and an angle between the first side face and the upper surface is smaller than an angle between the first side face and the lower surface.

11. The ball electrode forming method according to claim 10,
wherein the angle between the first side face and the upper surface is roughly 60° or lower.

12. The ball electrode forming method according to claim 8,
wherein each of the openings has a second side face extended from the upper surface to the lower surface, and an angle between the second side face and the upper surface is vertical.

13. The ball electrode forming method according to claim 12,
wherein a height of the second side face forming the vertical angle with the upper surface is equal to or higher than a radius of each of the solder balls.

14. The ball electrode forming method according to claim 8,
wherein the openings are interconnected at a lower surface side of the mask.

15. The ball electrode forming method according to claim 8,
wherein the semiconductor apparatus peeled off from the wiring board includes an electrically failed place.

16. The ball electrode forming method according to claim 8,
wherein the mask is made of a metal material.

17. A method of manufacturing a semiconductor apparatus, comprising:
preparing a semiconductor device having a plurality of electrode pads formed on a surface thereof;
preparing a mask having an upper surface, a lower surface and a plurality of through holes extending from the upper surface to the lower surface of the mask, each of the through holes having a top hole area at the upper surface and a bottom hole area at the lower surface, wherein the top hole area is smaller than the bottom hole area;
fixing the lower surface of the mask on the surface of the semiconductor device;
placing a plurality of solder balls through the through holes and on the electrode pads of the semiconductor device; and
electrically connecting the solder balls with the electrode pads, respectively.

18. A method of manufacturing a semiconductor apparatus according to claim 17, further comprising:
applying fluxes on the electrode pads before fixing the mask on the semiconductor device.

19. A method of manufacturing a semiconductor apparatus according to claim 17, wherein each of the holes has a side face extended from the upper surface to the lower surface, and an angle between the side face and the upper surface is smaller than an angle between the side face and the lower surface.

20. A method of manufacturing a semiconductor apparatus according to claim 17, wherein each of the holes has an upper cylinder hole extended from the upper surface to a middle of the mask and a lower cylinder hole extending from the middle of the mask to the lower surface.

21. A method of manufacturing a semiconductor apparatus according to claim 17, wherein each of the holes has a side face extended from the upper surface to a middle of the mask, an angle between the side face and the upper surface being smaller than 90 degrees, and the holes being interconnected with each other at the lower surface.

* * * * *